United States Patent [19]

Searle

[11] 4,054,829

[45] Oct. 18, 1977

[54] ELECTRICAL ISOLATORS

[75] Inventor: Terence John Searle, Walton on Thames, England

[73] Assignee: Memory Devices Limited, East Molesey, England

[21] Appl. No.: 689,930

[22] Filed: May 25, 1976

[30] Foreign Application Priority Data

May 31, 1975 United Kingdom ............... 23750/75

[51] Int. Cl.² ............................ G05F 1/12; H03F 1/34

[52] U.S. Cl. ...................................... 323/6; 323/44 R; 340/347 SY; 330/110

[58] Field of Search ...................... 323/6, 44 R, 48, 50, 323/84–88; 340/347 SY; 318/605; 330/26, 28, 79, 105, 110

[56] References Cited

U.S. PATENT DOCUMENTS

| | | | |
|---|---|---|---|
| 3,440,644 | 4/1969 | Burgis et al. | 340/347 SY |
| 3,815,012 | 6/1974 | Milkovic | 323/6 |
| Re. 28,851 | 6/1976 | Milkovic | 323/6 |

FOREIGN PATENT DOCUMENTS

| | | |
|---|---|---|
| 1,093,919 | 12/1967 | United Kingdom |
| 1,265,056 | 3/1972 | United Kingdom |

OTHER PUBLICATIONS

Analog-to-Digital/Digital-to-Analog Conversion Techniques by D. F. Hoeschele, Jr. Pub. 1968 by Wiley & Sons, pp. 348,350 relied upon.

*Primary Examiner*—Gerald Goldberg
*Attorney, Agent, or Firm*—Young & Thompson

[57] ABSTRACT

An electrical isolator has a transformer with an impedance in series with the primary winding and a high gain amplifier amplifying voltages induced in the secondary winding. Feedback is provided from the amplifier output to produce a current generating flux in the transformer core in opposition to flux produced by current in the primary. Thus the flux density is reduced and with a very high gain amplifier may be made close to zero and well away from saturation.

4 Claims, 3 Drawing Figures

ELECTRICAL ISOLATORS

Figure 1:
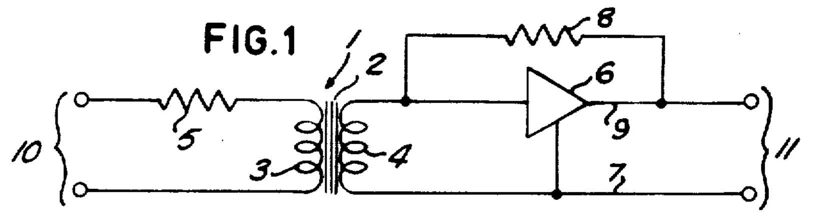

The present invention relates to electrical isolators. It is commonly required to isolate two parts of an electrical circuit from each other, that is to say to avoid any direct electrical connection between the isolated parts, whilst still providing means for the transmission of signals from one part to the other. Such isolating transmission means are commonly called electrical isolators and commonly utilize a transformer in which the primary and secondary windings are connected respectively to the two isolated parts of the circuit.

There are various well known problems arising from the use of transformers for the transmission of alternating current signals. In a normal transformer circuit, for efficient transformation, the primary inductance of the transformer should be sufficiently high to present sufficient impedance at the frequency of operation to avoid saturation. Although the achievement of such high primary inductance is not a great problem for high signal frequencies, at relatively low frequencies the number of windings in the primary winding has to be increased. However, for a particular transformer size, increasing the number of turns of the primary winding requires the use of finer wire. Such fine wire tends to increase resistive losses in the primary and reduces the voltage rating of the transformer. This leads to the well known feature that transformers for low frequencies are generally larger than those for high frequencies.

Clearly, the requirement always to have relatively large transformers for transforming low frequency signals is a significant constraint on the potential for miniaturising circuits employing such transformers. The present invention sets out to provide a circuit arrangement for an electrical isolator employing a transformer, whereby the physical dimensions of the transformer may be reduced whilst still giving satisfactory performance for low frequency signals.

According to the present invention an electrical isolator comprises a transformer with primary and secondary circuits which are electrically isolated from each other, the transformer having a core, the primary circuit including a primary winding on the core and an impedance in series with the primary winding, the secondary circuit including a secondary winding on the core, a high gain amplifier having input and output terminals and being connected to amplify voltage induced in the secondary winding and feedback means connected to the output terminal of the amplifier and arranged to produce magnetic flux in the core which is opposed to flux produced by current in the primary winding.

The isolator of the present invention operates to reduce the density of flux in the core whilst still permitting the satisfactory transmission of an alternating current signal from the primary circuit to the secondary circuit. The feedback means is effective to reduce the flux density in the core, which appears from the primary circuit to be equivalent to a reduction in the resistive load in the second circuit. Thus, the impedance in the primary circuit provided by the primary winding is reduced. If the amplitude of the signal voltage input to the primary circuit is maintained constant, the voltage drop across the primary winding will be reduced correspondingly because of the impedance (typically a resistance) in series in the primary circuit. Because the flux density in the core is reduced the voltage induced across the secondary winding is reduced correspondingly. However, the high gain amplifier has sufficient gain to provide a suitable signal amplitude at its output when amplifying the reduced voltage across the secondary winding.

In an ideal circuit, in which the high gain amplifier has infinite gain, the feedback means may be effective to reduce the flux density in the core to zero, i.e., zero induced voltage in the secondary winding. Then, the impedance to primary current presented by the primary winding is reduced to 0, or rather to the resistance of the primary winding. Thus, from the point of view of the primary winding, the secondary winding appears to be short circuited. The current in the primary winding and the overall input impedance to the isolator is then set by the impedance in series with the primary winding.

Although in practice, with non infinite gain amplifiers, the flux in the core of the transformer cannot be reduced to zero, the flux can be very substantially reduced whilst maintaining a satisfactory signal output level from the high gain amplifier.

Because the flux in the core of the transformer is reduced, a transformer of smaller physical size may be employed without the core of the smaller transformer running into saturation. Meanwhile, proper and accurate transformation of the signal amplitude voltage is maintained.

Looking at the invention from an other aspect, it provides a technique of magnetic flux neutralisation. The magnetic flux generated in a magnetic circuit by two or more forces of magneto motive force is sensed and thereby reduced. This principle is used to enable the transformer coupling of analogue signals to be carried out by transformers of reduced physical size.

In one preferred embodiment of the invention, the high gain amplifier is an inverting amplifier, the inverting input terminal whereof is connected to one side of the secondary winding, the other side being connected to a common line, and the feedback means comprises a feedback impedance, preferably a resistance, connected between the output terminal of the amplifier and said inverting input terminal thereof. Then in use, a current flows in the secondary winding via the feedback impedance which is effective to reduce the flux density in the transformer core.

In a second preferred embodiment, the feedback means comprises a feed back impedance, preferably a resistance, and a further winding on the core which are connected in series with each other and connected between the output terminal of the amplifier and a common line. The further winding is of course wound suitably so that the current flowing therein from the output of the amplifier is effective to reduce the flux density in the core.

Electrical isolators in accordance with the present invention may be used to advantage in apparatus for converting into digital form signals comprising alternating carrier voltages from an angle sensing device. Such devices include synchro and resolver devices and it is important that the carrier signals from such devices are d.c. isolated from the digital conversion circuitry. Thus, the present invention further envisages conversion apparatus of the above referred kind in which at least two isolators in accordance with the invention are provided having their respective primary circuits arranged for receiving said alternating carrier voltage signals such that the output signals from their high gain amplifiers represent the sine and cosine of the angle sensed by the sensing device, and further comprising a digital converter connected to receive said output signals for conversion into digital form.

A third isolator according to the invention may be provided in the conversion apparatus, for receiving a reference alternating voltage carrier signal, the output terminal of the high gain amplifier of said third isolator being also connected to the digital converter.

Figure 2:
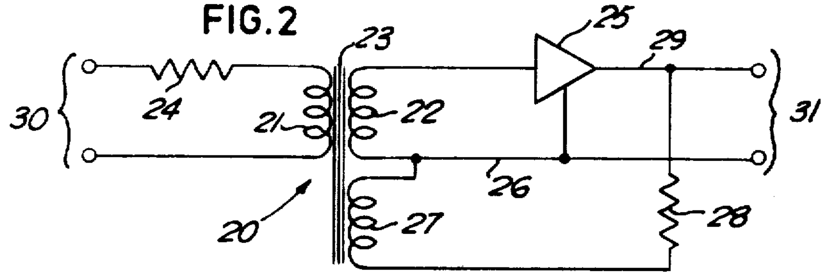
Figure 3:
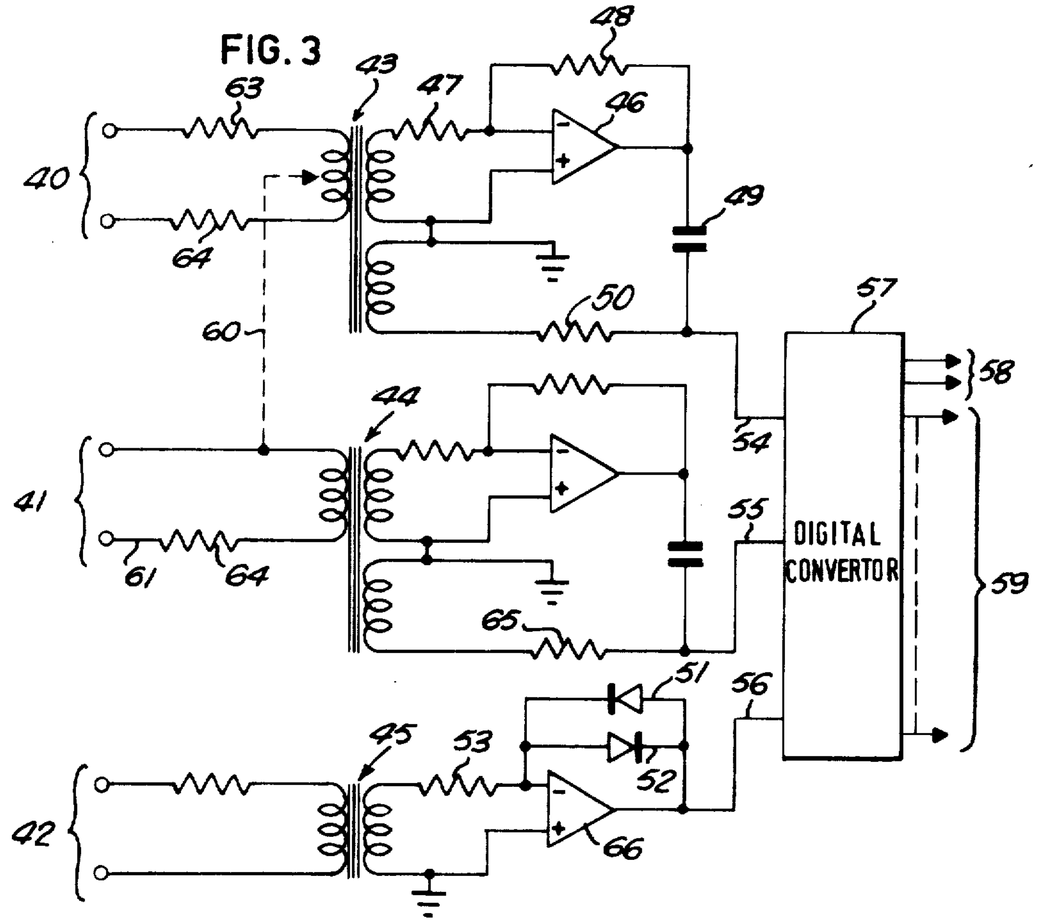

The invention will now be described in further detail and by way of example with reference to the accompanying drawings in which:

FIG. 1 represents one embodiment of electrical isolator in accordance with the invention, FIG. 2 represents a second embodiment of electrical isolator, and FIG. 3 is a schematic diagram representing a circuit employing embodiments of isolator in accordance with the invention.

The isolator of FIG. 1 has a transformer 1 having a core 2, a primary winding 3 and a secondary winding 4 the primary winding is connected in a primary circuit in series with a resistance 5. An inverting amplifier 6 has its inverting input connected to one side of the secondary winding 4. The other side of the secondary winding 4 is connected to a common line 7, which is typically an earth line. A feedback resistance 8 is connected between the inverting input terminal of the amplifier 6 and an output terminal 9 of the amplifier.

In operation, the circuit of FIG. 1 is effective to transmit an alternating voltage signal applied across terminals 10 of the primary circuit to appear across terminals 11 of the secondary circuit. Because there is no direct electrical connection between the primary and secondary circuits, these are isolated from each other and may be at different voltage levels. The amplifier 6 is a high gain amplifier so that the signal voltage amplitude at the output terminal 9 is much greater than the signal voltage amplitude induced across the secondary winding 4. Furthermore, the value of the feedback resistance 8 is chosen so that the feedback current flowing through it is very much greater than the input current flowing in the input terminal of the amplifier 6. Thus, the current flowing in the secondary winding 4 is substantially equal to the feedback current flowing in the feedback resistance 8. This current flowing in the secondary winding 4 is effective to produce flux in the core 2 which opposes flux produced by current in the primary winding 3, thereby reducing the impedance presented by the primary winding since the current in the primary winding 3 is limited by the series resistance 5, the overall flux density in the core 2 is thereby reduced.

In practice the gain of amplifier 6 is sufficiently high that the voltage across the secondary winding 4 is close to zero.

Further, the value of the resistance 5 is chosen to be substantially greater than the residual impedance presented by the primary winding 3. Then the voltage drop across the primary winding 3 is also close to zero, i.e. much less than the voltage drop across resistance 5, and the overall input impedance of the primary circuit is set by the value of resistance 5. Furthermore, since voltages across the windings 3 and 4 are close to zero, the overall gain of the isolator is set by the ratio of resistance 8 over resistance 5.

In the circuit of FIG. 2, a transformer 20 has a primary winding 21 and a secondary winding 22 on a core 23. The primary circuit includes a resistance 24 in series with the primary winding 21 and the secondary circuit includes a high gain amplifier 25 having its input terminal connected to one side of the secondary winding 22. The other side of the secondary winding 22 is connected to a common line 26. A further winding 27 on the core 23 is connected in series with a feedback resistance 28, the two being connected between the common line 26 and an output terminal 29 of the amplifier 25.

As for the circuit of FIG. 1, the circuit of FIG. 2 operates so that an alternating voltage input signal applied to terminals 30 of the primary circuit is transmitted to terminals 31 of the secondary circuit. However, in the circuit of FIG. 2, a feedback current flows via resistance 28 in the further winding 27 which is wound on the core in such a way as to produce a flux in the core opposing flux produced by current in the primary winding 21. Since the flux density in the core 23 is reduced, the voltage induced in the secondary winding 22 is also reduced, and in practice, with a high gain amplifier 25, the voltage across secondary winding 22 may be close to zero, i.e. very much less than the voltage at the output of the amplifier 25. Once again, provided the residual impedance presented by the primary winding 21 is much less than the value of the resistance 24, the gain of the isolator circuit is substantially equal to the ratio of resistance 28 over resistance 24.

FIG. 3 illustrates a circuit employing three examples of isolator. The circuit of FIG. 3 converts to a digital form the signals from a synchro or resolver device representing heading, bearing or another angle. Such synchro and resolver devices are common in, for example, radar equipment and usually provide the signals representing the angle, for example of the radar head, as amplitude modulated alternating voltage signals at a substantially fixed frequency. The angle may be represented either in a three phase form (synchro output) or a two phase sine and cosine form (resolver output). The circuit of FIG. 3 is adapted to receive either resolver or synchro signals as input and provide a digital output representative of the input angle, together with a digital representation of the quadrant of the angle.

The circuit has three pairs of input terminals 40,41 and 42. The terminals 40 and 41 are for receiving the two phase alternating voltage signals representing the sine and cosine of the angle, and terminals 42 are for receiving a reference signal by comparison with which the phase of the signals representing the angle can be determined.

It will be apparent to those practiced in the art of synchro (or resolver) to digital conversion, that it is necessary to isolate the digital conversion circuitry from any DC fluctuations in the alternating voltage signals while preserving closely the amplitude and phase relationships of the various signals.

For this purpose, the circuit of FIG. 3 includes three isolators having transformers, 43,44 and 45 respectively. As will become apparent, the two transformers 43 and 44 are connected in primary and secondary circuits to produce isolators each corresponding to that described with reference to FIG. 2. Transformer 45 on the other hand is connected to form an isolator corresponding to that of FIG. 1. Thus, each of transformers 43 and 44 have primary and secondary windings and also a further winding, whereas transformer 45 has only primary and secondary windings. The secondary circuits of transformers 43 and 44 are identical to each other and thus only that for transformer 43 will be described in detail.

An operational differential amplifier 46 is connected in the well known negative feedback mode with an input resistor 47 and a feedback resistor 48 to amplify the voltage across the secondary winding of the transformer 43. A capacitor 49 and resistor 50 are connected in series with the further winding of the transformer and between the output of the operational amplifier 46 and a common or earth line. It will be understood that the operational amplifier 46 with the resistors 47 and 48 combine to constitute a high gain amplifier having its input terminal connected to one end of the secondary winding of the transformer. The other end of the secondary winding is also connected to the common line. The capacitor 49 is of a value sufficiently high to present negligible impedance at the signal frequencies employed in the circuit and is purely for DC blocking. Thus it can be seen that the secondary circuit of the transformer 43 functionally corresponds to that of the circuit of FIG. 2.

Resistances 63 and 64 are provided in series with and on respective sides of the primary winding of the transformer 43. The values of resistors 63 and 64 together with that of resistor 50 are set to provide the desired gain for the isolator. However, these resistors may be adjustable if its desired to alter the gain.

The isolator containing transformer 44 is identical to that containing 43 except that only a single resistor 64 is provided in series with the primary winding of the transformer 44. However, once again the values of resistor 64 together with that of the resistor 65, which correspond to resistor 50, are set to establish the desired gain. Resistors 64 and 65 may be variable.

If it is desired to supply the circuit of FIG. 3 with three phase synchro signals, rather than sine/cosine signals, a link 60 (shown dotted in FIG. 3) is provided between one end of the primary winding of transformer 44 and a centre tap on the primary winding of transformer 43. Then the three phases of the synchro signal are connected, one to each of the two terminals 40 and the terminal 61 of the two terminals 41. It can be seen that the provision of the link 60 effects a Scott-T connection of the transformers 43 and 44. Thus, the gains of the two isolators can be selected so that the outputs of the isolators are two phase, sine/cosine, representations of the three phase synchro output.

Referring now to the isolator including the transformer 45, the secondary circuit of this isolator includes a differential operational amplifier 66 with its inverting input connected via a resistance 53 to one end of the secondary winding of the transformer 45. The other end of the secondary winding is connected to a common line, or earth, as is the non inverting input of the amplifier 66. A pair of back-to-back diodes 51 and 52 are connected between the output terminal of the amplifier 66 and the inverting input terminal thereof. The resistance 53 is purely for stability purposes and should be of low value. In fact, in some circumstances resistance 53 is not necessary. The diodes 51 and 52 constitute the feedback resistance of the circuit of FIG. 1 and correspond to resistance 8 therein.

As is well known, semiconductor diodes exhibit relatively high forward resistance for small forward bias voltages and very low forward resistance for forward bias voltages above the so called "threshold." Thus, the diodes 51 and 52 effectively clamp the output of the amplifier 66 so that it can swing only between plus and minus V, where V is the above mentioned forward bias threshold voltage of the diodes. For output voltages between these limits, the isolator provides a relatively high gain, thereby accurately defining at the output of amplifier 66 the cross over points of the reference signal provided at terminals 42. Furthermore, in view of the flux neutralising effect of the circuit arrangement as described in FIG. 1, it is insured that the core of transformer 45 does not saturate.

The isolated sine and cosine signals on lines 54 and 55 together with the isolated reference signal on line 56 are together fed to a digital converter 57. Various converters for providing digital representation of the angle together with identification of the quadrant are known in the art and may be employed as the convertor 57. Suffice it to say that the converter is effective by comparing the phases of the signals on line 54 and 55 with the phase of the reference signal on line 56 to identify the quadrant of the represented angle by a two bit word provided on outputs 58. The analogue values of the sine and cosine of the angle (represented by the amplitudes of the signals on lines 54 and 55) are converted to digital angle format and supplied on lines 59.

As previously explained herein the employment of the flux neutralisation technique for the isolators of the circuit of FIG. 3 enables the transformers 43,44 and 45 to be made considerably smaller whilst operating at the same low frequencies. By way of example, very satisfactory results are obtained for signals in the frequency range from 50 hertz to 2.8 kilohertz with transformers with a maximum dimension significantly less than 0.4 ins. A synchro to digital convertor employing such transformers can provide an input impedance for the synchro signals which is resistive and approximately equal to 200 K ohms from line to line for a 90 volt synchro signal. The corresponding input impedance for 11.8 volt synchro signals is 26 K ohms.

I claim:

1. An electrical isolator comprising a transformer with primary and secondary circuits which are electrically isolated from each other, the transformer having a core, the primary circuit including a primary winding on the core and an impedance in series with the primary winding, the secondary circuit including a secondary winding on the core, a high gain amplifier having input and output terminals and connected to amplify voltage induced in the secondary winding and a feedback circuit connected and arranged to conduct a feedback current from the output terminal of the amplifier to produce magnetic flux in the core, which is opposed to flux produced by current in the primary winding, the feedback circuit comprising a feedback impedance and a further winding on the core which are connected in series with each other and connected between the output terminal of the amplifier and a common line.

2. Apparatus for converting into digital form signals comprising alternating carrier voltages from an angle sensing device, comprising three electrical isolators each comprising a transformer with primary and secondary circuits which are electrically isolated from each other, the transformer having a core, the primary circuit including a primary winding on the core and an impedance in series with the primary winding, the secondary circuit including a secondary winding on the core, a high gain amplifier having input and output terminals and connected to amplify voltage induced in the secondary winding and a feedback circuit connected and arranged to conduct feedback current from the output terminal of the amplifier to produce magnetic flux in the core which is opposed to flux produced by current in the primary winding, two of the isolators having their primary circuits arranged for receiving said alternating carrier voltage signals such that the output signals from their high gain amplifiers represent the sine and cosine of the angle sensed by the sensing device and the third said isolator being for receiving a reference alternating voltage carrier signal, and the apparatus further comprising a digital converter connected to receive said output signals of said two of the isolators for conversion into digital form and the output signal of said third isolator.

3. Apparatus as claimed in claim 2 wherein the feedback circuit of said third isolator comprises a pair of back-to-back diodes connected between the output terminal of the high gain amplifier and an inverting input terminal thereof, one side of the secondary winding being connected also to the inverting input terminal and the other side being connected to a common line.

4. Apparatus for converting into digital form signals comprising alternating carrier voltages from an angle sensing device, comprising at least two electrical isolators each comprising a transformer with primary and secondary circuits which are electrically isolated from each other, the transformer having a core, the primary circuit including a primary winding on the core and an impedance in series with the primary winding, the secondary circuit including a secondary winding on the core, a high gain amplifier having input and output terminals and connected to amplify voltage induced in the secondary winding and a feedback circuit connected and arranged to conduct a feedback current from the output terminal of the amplifier to produce magnetic flux in the core which is opposed to flux produced by current in the primary winding, the feedback circuit comprising a feedback impedance and a further winding on the core which are connected in series with each other and connected between the output terminal of the amplifier and a common line, the isolators having their primary circuits arranged for receiving said alternating carrier voltage signals such that the output signals from their high gain amplifiers represent the sine and cosine of the angle sensed by the sensing device, and the apparatus further comprising a digital converter connected to receive said output signals for conversion into digital form.

* * * * *